United States Patent
Bouhamame

(10) Patent No.: US 12,549,164 B2
(45) Date of Patent: Feb. 10, 2026

(54) SINGLE VCO FREQUENCY SYNTHESIZER ARCHITECTURE FOR UWB APPLICATIONS

(71) Applicant: Qorvo US, Inc., Greensboro, NC (US)

(72) Inventor: Mohamed Bouhamame, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 86 days.

(21) Appl. No.: 18/581,462

(22) Filed: Feb. 20, 2024

(65) Prior Publication Data
US 2024/0333269 A1   Oct. 3, 2024

Related U.S. Application Data

(60) Provisional application No. 63/493,178, filed on Mar. 30, 2023.

(51) Int. Cl.
*H03K 5/00* (2006.01)
*H03L 7/197* (2006.01)

(52) U.S. Cl.
CPC ....... *H03K 5/00006* (2013.01); *H03L 7/1976* (2013.01)

(58) Field of Classification Search
CPC ......... H03K 5/00006; H03L 7/06; H03L 7/08; H03L 7/087; H03L 7/0891; H03L 7/0992;
(Continued)

(56) References Cited

U.S. PATENT DOCUMENTS

| 6,914,489 B2 | 7/2005 | Charlon |
| 2007/0026816 A1* | 2/2007 | Heidari ............... H03D 7/1441 455/260 |

(Continued)

FOREIGN PATENT DOCUMENTS

| CN | 103501175 B | 2/2016 |
| GB | 2430089 A | 3/2007 |
| KR | 20210047765 A | 4/2021 |

OTHER PUBLICATIONS

Extended European Search Report for European Patent Application No. 24166614.8, mailed Sep. 3, 2024, 8 pages.
(Continued)

*Primary Examiner* — Young T. Tse
(74) *Attorney, Agent, or Firm* — Withrow & Terranova, P.L.L.C.

(57) ABSTRACT

The present disclosure relates to a frequency synthesizer capable of generating a full spectrum for ultra-wideband applications by utilizing a single voltage-controlled oscillator (VCO). The disclosed frequency synthesizer includes a phase-frequency detector (PFD), a charge pump (CP), a VCO, a feedback divider, and a divider bank. The PFD, the CP, the VCO, and the feedback divider are coupled in series in a closed loop, while the divider bank follows the VCO and is not included in the closed loop. Herein, the VCO has a tuning range less than 35%. The divider bank includes two or more divider branches parallel to each other, each of which is configured to provide a different division ratio. An oscillating spectrum of the VCO and division ratios of the two or more divider branches are selected such that the divider bank is capable of providing a continuous spectrum with at least a 64% frequency coverage.

21 Claims, 6 Drawing Sheets

(58) Field of Classification Search
CPC ......... H03L 7/18; H03L 7/183; H03L 7/1976; H04L 7/033
USPC ......... 375/326–328, 373–376; 327/145–148, 327/151, 155–157, 160; 455/260
See application file for complete search history.

(56) References Cited

U.S. PATENT DOCUMENTS

| | | | |
|---|---|---|---|
| 2007/0259640 A1* | 11/2007 | Pandey | H04L 27/2626 |
| | | | 455/260 |
| 2008/0211560 A1 | 9/2008 | Lam | |
| 2009/0061804 A1* | 3/2009 | Chang | H03L 7/099 |
| | | | 455/260 |
| 2013/0127499 A1 | 5/2013 | Mo et al. | |
| 2018/0191359 A1* | 7/2018 | Petrov | H03L 7/0891 |
| 2019/0372576 A1* | 12/2019 | Jung | H03B 5/1212 |
| 2020/0067517 A1 | 2/2020 | Kearney et al. | |
| 2020/0220550 A1 | 7/2020 | Aga et al. | |
| 2024/0322925 A1* | 9/2024 | Tsai | H04B 1/403 |

OTHER PUBLICATIONS

Van Sinderen, J. et al., "25.3 A 48-860MHz Digital Cable Tuner IC with Integrated RF and IF Selectivity," 2003 IEEE International Solid-State Circuits Conference (ISSC), Session 25, RF Infotainment, Paper 25.3, Feb. 12, 2003, IEEE, 10 pages.

* cited by examiner

| Group | UWB Channel | Center Frequency (MHz) | Bandwidth (MHz) | Min Frequency -- Max Frequency (MHz) |
|---|---|---|---|---|
| Group 1 (Low Band) | 1 | 3494.4 | 499.2 | 3244.8-3744 |
| | 2 | 3993.6 | 499.2 | 3744-4243.2 |
| | 3 | 4492.8 | 499.2 | 4243.2-4742.4 |
| | 4 | 3993.6 | 1331.2 | 3328-4659.2 |
| Group 2 (High Band) | 5 | 6489.6 | 499.2 | 6240-6739.2 |
| | 6 | 6988.8 | 499.2 | 6739.2-7238.4 |
| | 7 | 6489.6 | 1081.6 | 5948.8-7030.4 |
| | 8 | 7488 | 499.2 | 7238.4-7737.6 |
| | 9 | 7987.2 | 499.2 | 7737.6-8236.8 |
| | 10 | 8486.4 | 499.2 | 8236.8-8736 |
| | 11 | 7987.2 | 1331.2 | 7321.6-8652.8 |
| | 12 | 8985.6 | 499.2 | 8736-9235.2 |
| | 13 | 9484.8 | 499.2 | 9235.2-9734.4 |
| | 14 | 9984 | 499.2 | 9734.4-10233.6 |
| | 15 | 9484.8 | 1354.97 | 8807.3-10162.3 |

FIG.1

SINGLE VCO FREQUENCY SYNTHESIZER ARCHITECTURE FOR UWB APPLICATIONS

RELATED APPLICATIONS

This application claims the benefit of provisional patent application Ser. No. 63/493,178, filed Mar. 30, 2023, the disclosure of which is hereby incorporated herein by reference in its entirety.

FIELD OF THE DISCLOSURE

The present disclosure relates to a frequency synthesizer architecture capable of generating different local oscillator frequencies for ultra-wideband (UWB) applications by utilizing a single voltage-controlled oscillator (VCO).

BACKGROUND

Ultra-wideband (UWB) is a radio technology for short-range wireless communications at low energy levels. UWB has a wide range of applications in radar imaging, precise locating, and tracking. With the development of smart devices, UWB applications are increasingly utilized in smartphones, smart watches, and more.

Typically, UWB operates at very high frequencies, and as its name denotes, UWB covers a wide spectrum of several GHz. Conventional frequency synthesizers usually utilize multiple voltage-controlled oscillators (VCOs) to target different UWB frequencies. However, the utilization of multiple VCOs adds complexity to the design and leads to large chip sizes and consequently high overall cost. On the other hand, if one frequency synthesizer utilizes a single VCO with a large tuning range (e.g., larger than 35%) to cover a wide spectrum, the starting conditions, phase noise performance, etc. will be compromised.

Accordingly, there remains a need for an improved frequency synthesizer design that is capable of providing multiple UWB frequencies without using multiple VCOs or a large tuning range VCO, so as to reduce the size and cost of the final products.

SUMMARY

The present disclosure relates to a frequency synthesizer capable of generating different local oscillator (LO) frequencies for ultra-wideband (UWB) applications by utilizing a single voltage-controlled oscillator (VCO). The disclosed frequency synthesizer includes a phase-frequency detector (PFD), a charge pump (CP), a high-frequency VCO, a feedback divider, and a divider bank. The PFD, the CP, the high-frequency VCO, and the feedback divider are coupled in series in a closed loop, while the divider bank follows the high-frequency VCO and is not included in the closed loop. Herein, the high-frequency VCO has a tuning range of less than 35% and is the only VCO within the frequency synthesizer. The divider bank includes two or more divider branches parallel to each other, each of which is configured to provide a different division ratio. An oscillating spectrum of the high-frequency VCO and division ratios of the two or more divider branches are carefully selected such that the divider bank is capable of providing a continuous spectrum with at least a 64% frequency coverage.

In one embodiment of the frequency synthesizer, the spectrum provided by the divider bank covers all ultra-wideband (UWB) channels in Group 2.

In one embodiment of the frequency synthesizer, the divider bank further includes a multiplexer (MUX), which is configured to select one output from the two or more divider branches.

According to one embodiment, the frequency synthesizer further includes a group divider, a first group switch, and a second group switch. Herein, the group divider and the first group switch are coupled in series between the MUX of the divider bank and an output terminal of the frequency synthesizer, while the second group switch is parallel to the first group switch and coupled between the MUX of the divider bank and the output terminal of the frequency synthesizer.

In one embodiment of the frequency synthesizer, when the first group switch is open and the second group switch is closed, the output terminal of the frequency synthesizer is eligible to provide a spectrum covering all UWB channels in Group 2. When the first group switch is closed and the second group switch is open, the output terminal of the frequency synthesizer is eligible to provide a spectrum proportional to the Group 2 UWB channels.

In one embodiment of the frequency synthesizer, the group divider has a division ratio of 2. When the first group switch is closed, and the second group switch is open, the output terminal of the frequency synthesizer is eligible to provide a spectrum covering all UWB channels in Group 1.

According to one embodiment, the frequency synthesizer further includes a buffer before the output terminal of the frequency synthesizer. Herein, the group divider and the first group switch are coupled in series between the MUX of the divider bank and the buffer, and the second group switch is parallel to the first group switch and coupled between the MUX of the divider bank and the buffer.

In one embodiment of the frequency synthesizer, the high-frequency VCO has an oscillating spectrum that is N times a range of 16372 MHz to 20468 MHz, where N is an integer. The two or more divider branches include a first divider branch, a second divider branch, and a third divider branch with a division ratio of 2*N, a division ratio of 2.5*N, and a division ratio of 3*N, respectively.

In one embodiment of the frequency synthesizer, the high-frequency VCO is capable of providing in-phase/quadrature (I/Q) signals, and N is equal to 1.

In one embodiment of the frequency synthesizer, N is equal to 2. Herein, the first divider branch is implemented by two divide-by-2 dividers coupled in series, the second divider branch is implemented by one divide-by-2 divider and one divide-by-2.5 divider coupled in series, and the third divider branch is implemented by one divide-by-2 divider and one divide-by-3 divider coupled in series.

In one embodiment of the frequency synthesizer, the tuning range of the high-frequency VCO is limited to 15%-25%.

In one embodiment of the frequency synthesizer, the tuning range of the high-frequency VCO is less than 30%.

In one embodiment of the frequency synthesizer, the two or more divider branches are implemented by current mirror logic (CML) type dividers or true single phase clocked (TSPC) type dividers.

According to one embodiment, the frequency synthesizer further includes a buffer, which is coupled between the high-frequency VCO and the feedback divider, included in the closed loop, and coupled between the high-frequency VCO and the divider bank.

According to one embodiment, a communication device includes a baseband processor, receive circuitry, and transmit circuitry. Herein, at least one of the baseband processer, the transmit circuitry, and the receive circuitry includes a frequency synthesizer. The frequency synthesizer includes a PFD, a CP, a high-frequency VCO, a feedback divider, and a divider bank. The PFD, the CP, the high-frequency VCO, and the feedback divider are coupled in series in a closed loop, while the divider bank follows the high-frequency VCO and is not included in the closed loop. The high-frequency VCO has a tuning range of less than 35% and is the only VCO within the frequency synthesizer. The divider bank includes two or more divider branches parallel to each other, each of which is configured to provide a different division ratio. An oscillating spectrum of the high-frequency VCO and division ratios of the two or more divider branches are carefully selected such that the divider bank is capable of providing a continuous spectrum with at least a 64% frequency coverage.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a list of ultra-wideband (UWB) frequency channels.

Figure 2:
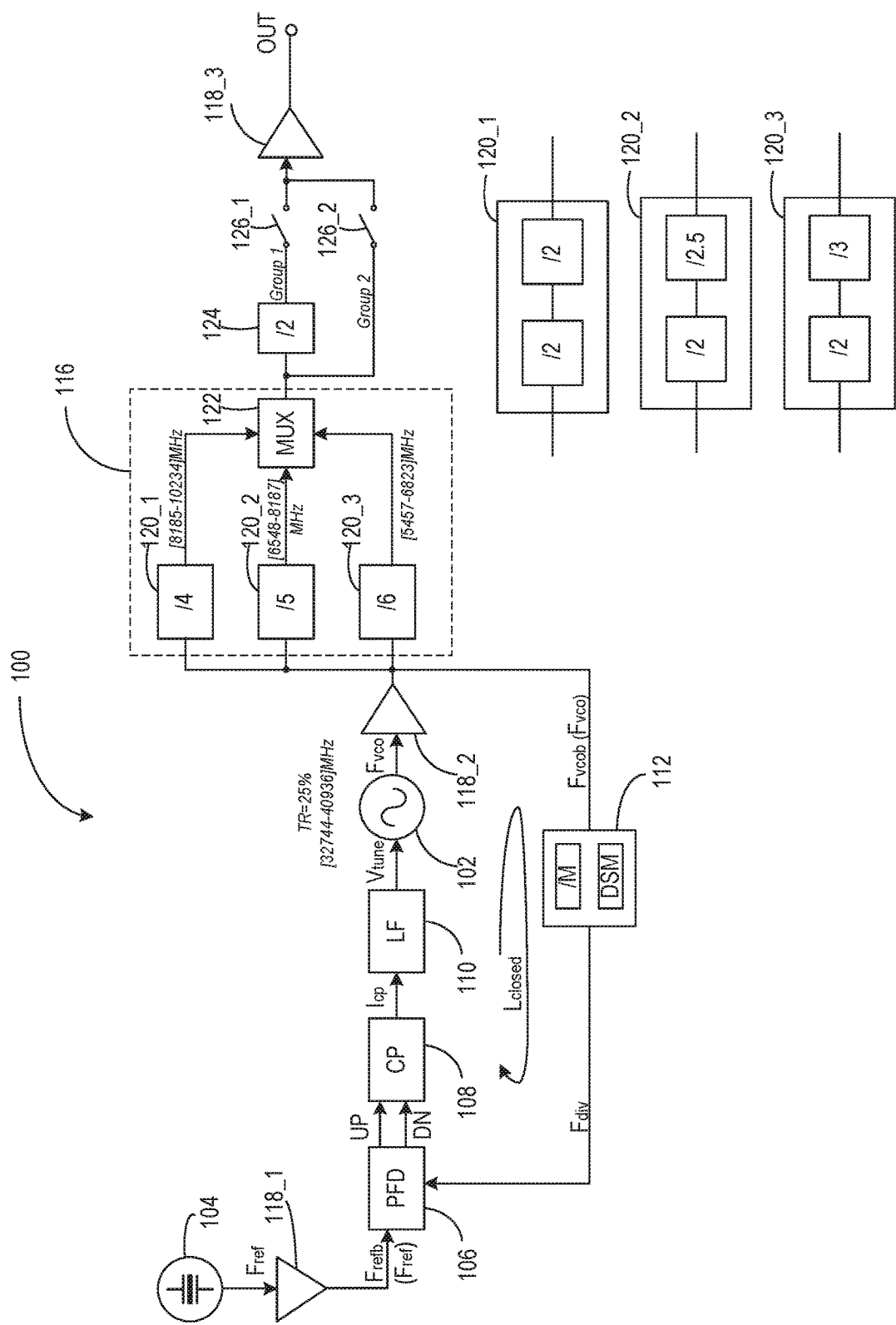
FIG. 2 illustrates an exemplary implementation of a frequency synthesizer with a single voltage-controlled oscillator (VCO) covering all UWB frequency channels according to some embodiments of the present disclosure.

It will be understood that for clear illustrations, FIGS. 1-6 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a frequency synthesizer capable of generating different local oscillator (LO) frequencies for ultra-wideband (UWB) applications by utilizing a single voltage-controlled oscillator (VCO). Herein, the single VCO has a relatively small tuning range (tuning range=the maximum oscillating frequency/the minimum oscillating frequency-100%, e.g., between 25%-30%).

FIG. 1 provides a list of UWB frequency channels covering almost a 7000 MHz spectrum. Typically, the UWB frequency channels can be divided into a low-band Group 1 with four UWB frequency channels and a high band Group 2 with eleven UWB frequency channels. The center frequency of group 1 varies from 3494.4 MHz to 4492.8 MHz, while the center frequency of group 2 varies from 6489.6 MHz to 9984 MHz.

For radio frequency applications, in-phase/quadrature (I/Q) signals are often used, which include two sinusoids having the same frequency and a relative phase shift of 90°. To achieve I/Q signals at a target UWB frequency, a typical implementation of one frequency synthesizer is that a VCO oscillates twice the target UWB frequency and is followed by a divide-by-2 divider. As such, within the divide-by-2 divider, output from the VCO can be sampled at half the frequency of the output on different rising/falling edges to obtain I/Q signals at the target UWB frequency.

In a non-limited example, when UWB channel 5 (centered at 6489.6 MHz) and UWB channel 12 (centered at 8985.6 MHZ) are the target UWB frequency channels, a typical implementation of one frequency synthesizer is to utilize two narrow-tuning-range VCOs (e.g., tuning range smaller than 30%), one oscillating around 12979.2 MHZ (twice the center frequency of UWB channel 5) and another one oscillating around 17971.2 MHZ (twice the center frequency of UWB channel 12). To cover more UWB channels, multiple narrow-tuning-range VCOs will be needed. However, implementing a relatively large number of VCOs will result in bulky and costly devices. Alternatively, if one conventional frequency synthesizer utilizes a single VCO to cover UWB channel 5 and UWB channel 12, a tuning range of such single VCO needs to be over 45% ($f_{max-ch12}/f_{min-ch5}-100\%$). To cover the entire UWB channels in Group 2, the tuning range of the single VCO in the conventional frequency synthesizer may be as high as about 64%, which will significantly downgrade the phase noise performance and the startup time of the single VCO.

FIG. 2 illustrates an exemplary frequency synthesizer 100 with a single VCO 102 covering all UWB frequency channels according to some embodiments of the present disclosure. Herein, the tuning range of the VCO 12 is about 25%. For the purpose of this illustration, the frequency synthesizer 100 includes a crystal oscillator 104, a phase-frequency detector (PFD) 106, a charge pump (CP) 108, a loop filter (LF) 110, the VCO 102, a feedback divider 112, and a divider bank 116. Herein, the PFD 106, the CP 108, the LF 110, the VCO 102, and the feedback divider 112 are coupled in a series in a closed loop $L_{closed}$, the crystal oscillator 104 is coupled to the PFD 106, and the divider bank 116 is coupled to the VCO 102. In some applications, the frequency synthesizer 100 may further include a first buffer 118_1 coupled between the crystal oscillator 104 and the PFD 106, and a second buffer 118_2 coupled between the VCO 102 and the divider bank 116 (also between the VCO 102 and the feedback divider 112).

In detail, the crystal oscillator 104 is configured to provide a reference signal $F_{ref}$ to the PFD 106. If the first buffer 118_1 exists between the crystal oscillator 104 and the PFD 106, a buffered reference signal $F_{refb}$ will be provided to the PFD 106 from the first buffer 118_1. The PFD 106 is configured to compare the reference signal Fret with a feedback signal $F_{div}$ from the feedback divider 112 and configured to provide phase difference outputs UP and DN to the CP 108. Herein, the feedback signal $F_{div}$ provided by the feedback divider 112 is based on an oscillating signal $F_{vco}$. The feedback divider 112 may be an integral divider (i.e., /M, M is an integer) or a fractional divider (combining the integral divider /M and a delta-sigma-modulator, DSM). If the second buffer 118_2 exists between the VCO 102 and the feedback divider 112, the feedback signal $F_{div}$ provided by the feedback divider 112 is based on a buffered oscillating signal $F_{vcob}$ from the second buffer 118_2. The CP 108 is configured to utilize the received phase difference outputs UP and DN to raise or lower a charge current $I_{cp}$, which is converted to a tuning voltage $V_{tune}$ by utilizing a capacitor (not shown) in the LP 110. The tuning voltage $V_{tune}$ is used to tune the oscillating signal $F_{vco}$ of the VCO 102. Once the feedback signal $F_{div}$ matches the reference signal $F_{ref}$, the tuning voltage $V_{tune}$ will not change, and in consequence, the oscillating signal $F_{vco}$ provided by the VCO 102 will be locked.

The divider bank 116 follows the VCO 102 (or follows the second buffer 118_2 if it exists) but is not included in the closed loop $L_{closed}$. In order to get a desirable phase noise performance and an adequate startup condition, the VCO 102 is limited to a tuning range of less than 25%. And in some applications, the VCO 102 may reach a maximum tuning range of up to 30% or 35%. Note that the tuning range of the VCO 102 should not be beyond 35% for the reason discussed above. A combination of the VCO 102 and the divider bank 116 is configured to provide a wide spectrum with at least a 64% frequency coverage (frequency coverage=maximum frequency/minimum frequency-100%) to fully cover all UWB channels in Group 2 ($f_{max-group2}/f_{min-group2}-100\%=64\%$).

For a nonlimited example, the VCO 102 has a 32744 MHz-40936 MHZ oscillating spectrum with a 25% tuning range (40936 MHz/32744 MHz-100%=25%), while the divider bank 116 includes three divider branches 120 and a multiplexer (MUX) 122. The three divider branches are a first divider branch 120_1 with a division ratio of 4, a second divider branch 120_2 with a division ratio of 5, and a third divider branch 120_3 with a division ratio of 6. The first divider branch 120_1, the second divider branch 120_2, and the third divider branch 120_3 are parallel to each other and each is coupled between the VCO 102 (or the second buffer 118-2 if it exists) and the MUX 122. A first output signal provided by the first divider branch 120_1 varies between 8185 MHz to 10234 MHz, a second output signal provided by the second divider branch 120_2 varies between 6548 MHz to 8187 MHz, and a third output signal provided by the third divider branch 120_3 varies between 5457 MHz to 6823 MHz. It is noted that outputs from the three divider branches 120 cover the entire spectrum of Group 2 UWB channels. The MUX 122 is configured to select one of the first output signal, the second output signal, and the third output signal based on a target UWB channel.

It is noted that the UWB frequencies in Group 1 can be generated from the UWB frequencies in Group 2 using a simple division by 2. Herein, once the combination of the VCO 102 and the divider bank 116 is configured to provide a continuous spectrum from 5457 MHz to 10234 MHZ (with an 87.6% frequency coverage), the UWB frequencies in Group 1 (3244.8 MHz-4742.4 MHZ) can also be covered by using a simple division by 2 after the combination of the VCO 102 and the divider bank 116 (2728 MHz-5117 MHz).

To cover the entire spectrum of the UWB channels, the frequency synthesizer 100 further includes a group divider 124 with a division ratio of 2, a first group switch 126_1, and a second group switch 126_2. Optionally, the frequency synthesizer 100 may also include a third buffer 118_3 before an output terminal OUT. The group divider 124 and the first group switch 126_1 are coupled in series between the divider bank 116 and the output terminal OUT (or between the divider bank 116 and the third buffer 118_3 if it exists), while the second group switch 126_2 is parallel to the first group switch 126_1 and coupled between the divider bank 116 and the output terminal OUT (or between the divider bank 116 and the third buffer 118_3 if it exists). Herein, the group divider 124 and the first group switch 126_1 may exchange positions (i.e., the group divider 124 may be coupled to the MUX 122 before the first group switch 126_1, or the first group switch 126_1 may be coupled to the MUX 122 before the group divider 124). When the Group 1 channels are targeted, the first group switch 126_1 is closed and the second group switch 126_2 is open. When the Group 2 channels are targeted, the first group switch 126_1 is open and the second group switch 126_2 is closed.

In one embodiment, the first divider branch 120_1 may be implemented by two divide-by-2 dividers coupled in series, the second divider branch 120_2 may be implemented by one divide-by-2 divider and one divide-by-2.5 divider coupled in series, and the third divider branch 120_3 may be implemented by one divide-by-2 divider and one divide-by-3 divider coupled in series. The divide-by-2 divider, divide-by-2.5 divider, and divide-by-3 divider are easily designed and implemented. Because each divider branch 120 at least includes one divide-by-2 divider, it is capable of achieving I/Q signals at an output of the divider bank 116/output of the MUX 122.

Figure 3:
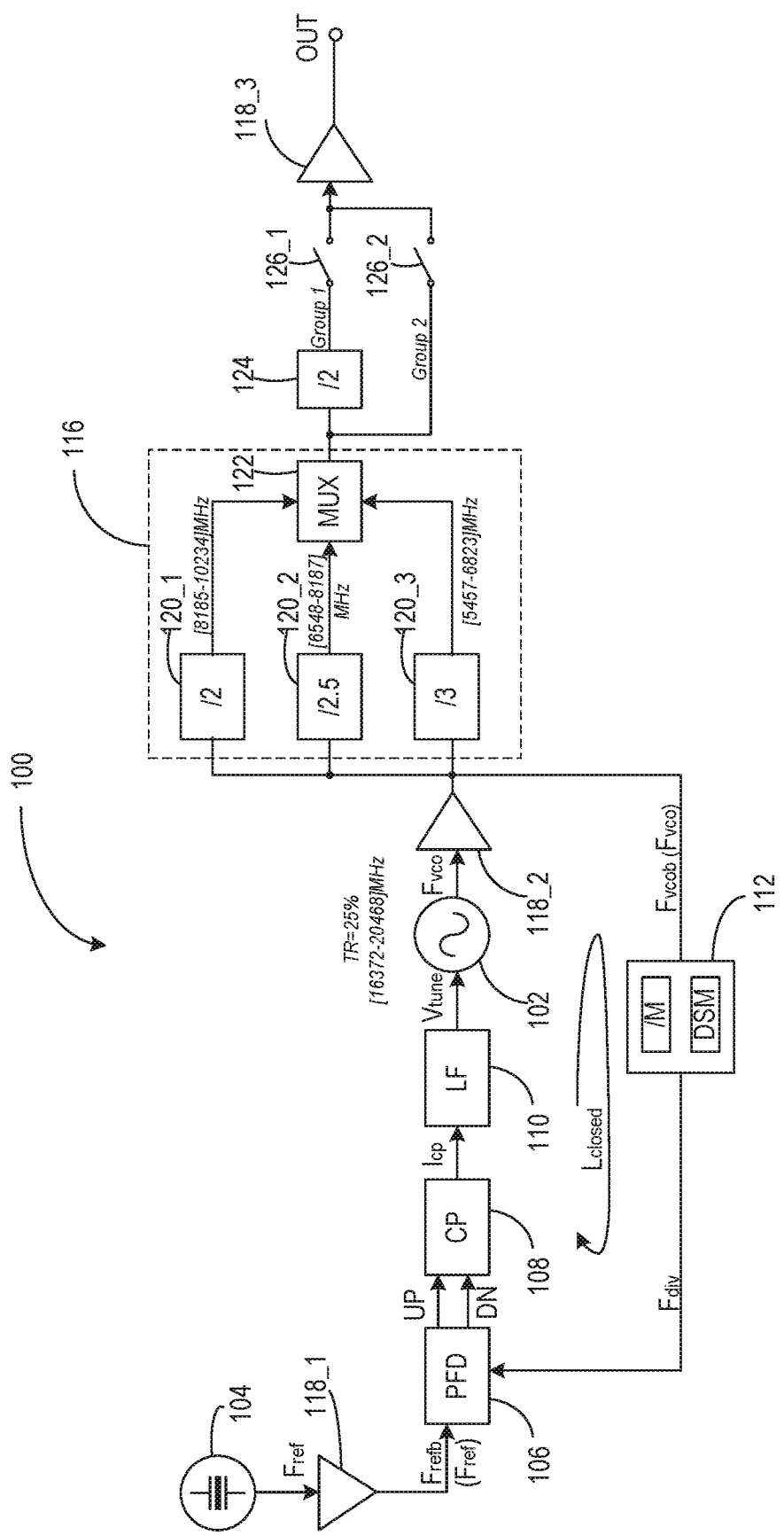
FIG. 3 illustrates an alternative implementation of the frequency synthesizer with the single VCO to cover all UWB frequency channels according to some embodiments of the present disclosure.

In some applications, the VCO 102 may directly provide I/Q signals and does not require a subsequent divided-by-2 divider to achieve I/Q signals (such as Rotary Wave Traveling VCOs, IQ crossed coupled VCOs, Ring Oscillators, etc.). In consequence, the oscillating frequency of the VCO 102 may decrease and the division ratios in the divider bank 116 may decrease. For a nonlimited example, the VCO 102 has a 16372 MHZ-20468 MHz oscillating spectrum with a 25% tuning range, while the divider bank 116 includes the three divider branches 120 with a division ratio of 2, a division ratio of 2.5, and a division ratio of 3, respectively, as illustrated in FIG. 3. Herein, the combination of the VCO 102 and the divider bank 116 is still capable of providing UWB frequencies for the entire Group 2. In addition, by adding the group divider 124, the first group switch 126-1, and the second group switch 126-2 after the divider bank 116, the frequency synthesizer 100 is capable of covering all UWB channels.

It is clear that by carefully selecting the oscillating spectrum of the VCO 102 and the division ratios in the divider bank 116, the frequency synthesizer 100 is capable of providing a wide spectrum (i.e., a wide frequency coverage) without multiple VCOs or a wide-tuning-range VCO. Due to the utilization of the single narrow-tuning-range VCO 102, the frequency synthesizer 100 can significantly save device area and cost, and will not sacrifice the phase noise performance, starting conditions, and design complexity of the VCO.

Figure 4:
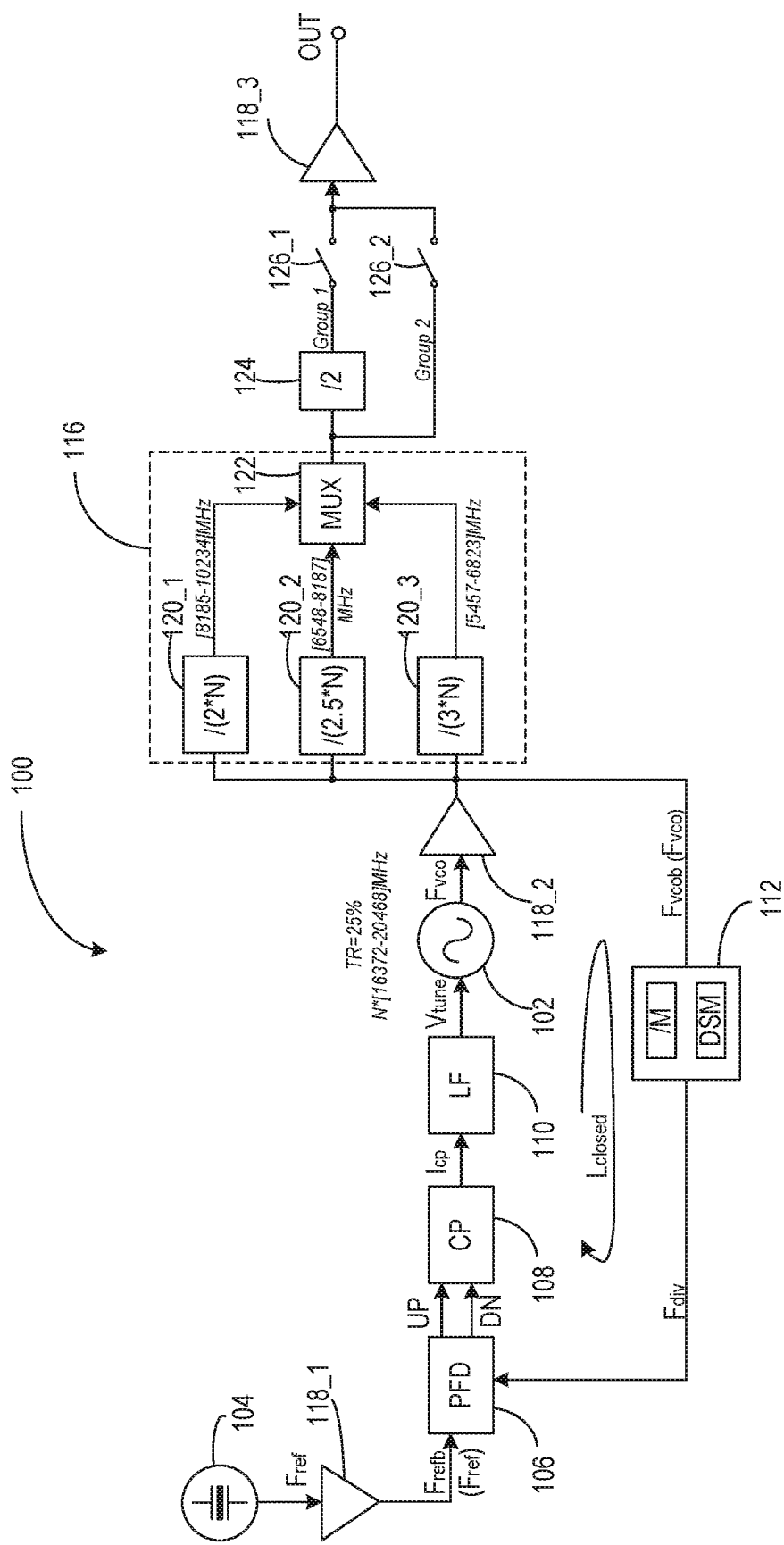
FIG. 4 illustrates a generalized implementation of the frequency synthesizer with the single VCO to cover all UWB frequency channels according to some embodiments of the present disclosure.

For a nonlimited example, when the oscillating spectrum of the VCO 102 is N*[16372 MHz-20468 MHz] (i.e., N times the 16372 MHZ-20468 MHz range, N is an integer) and the divider bank 116 includes three divider branches 120 with a division ratio of 2*N, a division ratio of 2.5*N, and a division ratio of 3*N, respectively, the frequency synthesizer 100 is capable of providing the entire UWB spectrum (i.e., covering all UWB channels), as shown in FIG. 4. Due to the high oscillating frequency of the VCO 102, the LF 110 will be easily integrated.

Figure 5:
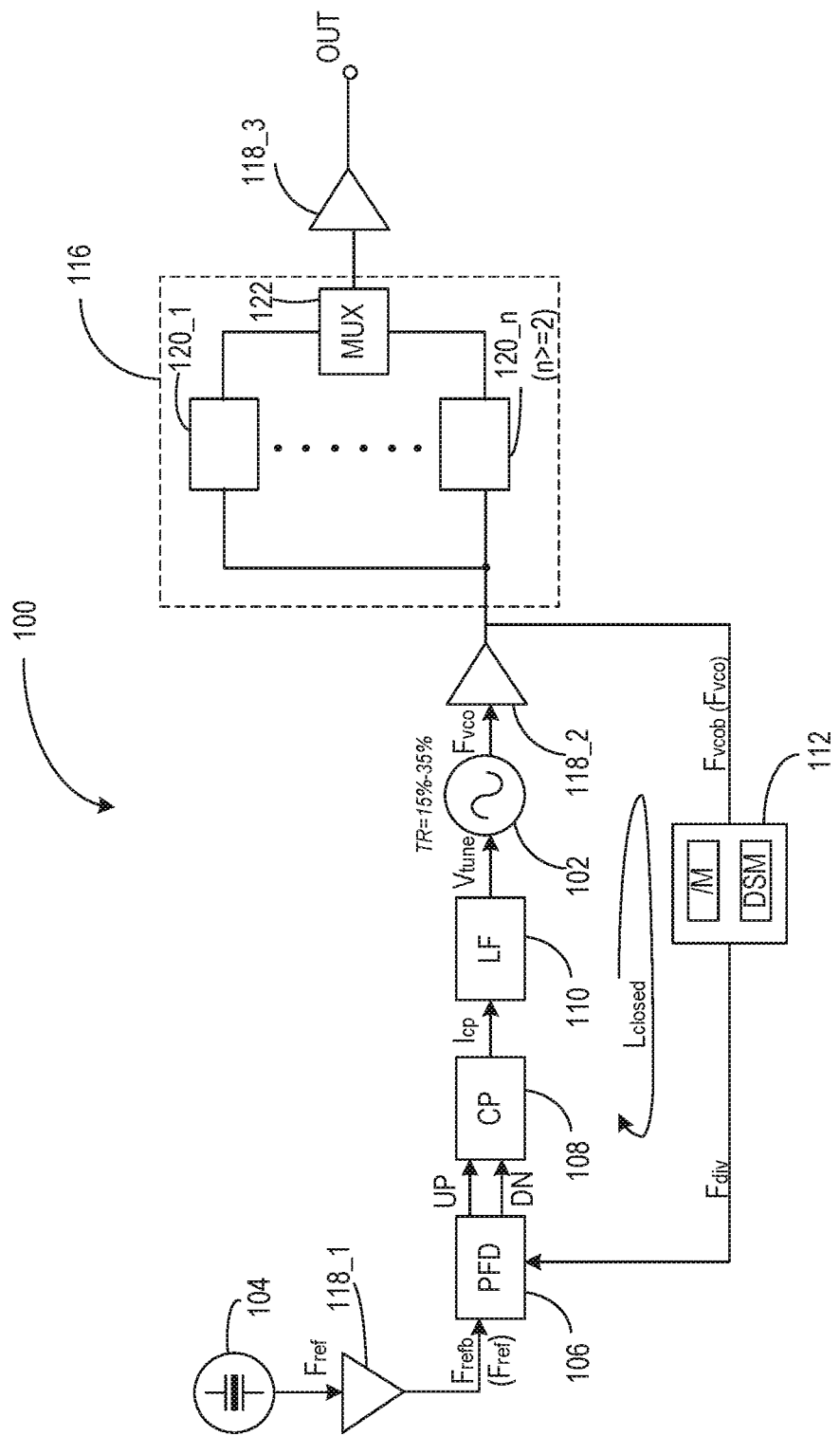
FIG. 5 illustrates another generalized implementation of the frequency synthesizer with the single VCO according to some embodiments of the present disclosure.

For different applications, the oscillating spectrum of the VCO 102 may vary (larger or smaller) but the tuning range of the VCO 102 is limited to 15%-25%, or up to 30%. The divider bank 116 may include two or more divider branches 120 and each branch 120 has a different division ratio, as illustrated in FIG. 5. Typically, the division ratios in the divider bank 116 are common and easily implemented, like current mirror logic (CML) type dividers, true single phase clocked (TSPC) type dividers, etc. In some cases, the group divider 124, the first group switches 126-1, and the second group switches 126-2 may be omitted. The third buffer 118_3 is coupled between the divider bank 116 and the output terminal OUT.

Figure 6:
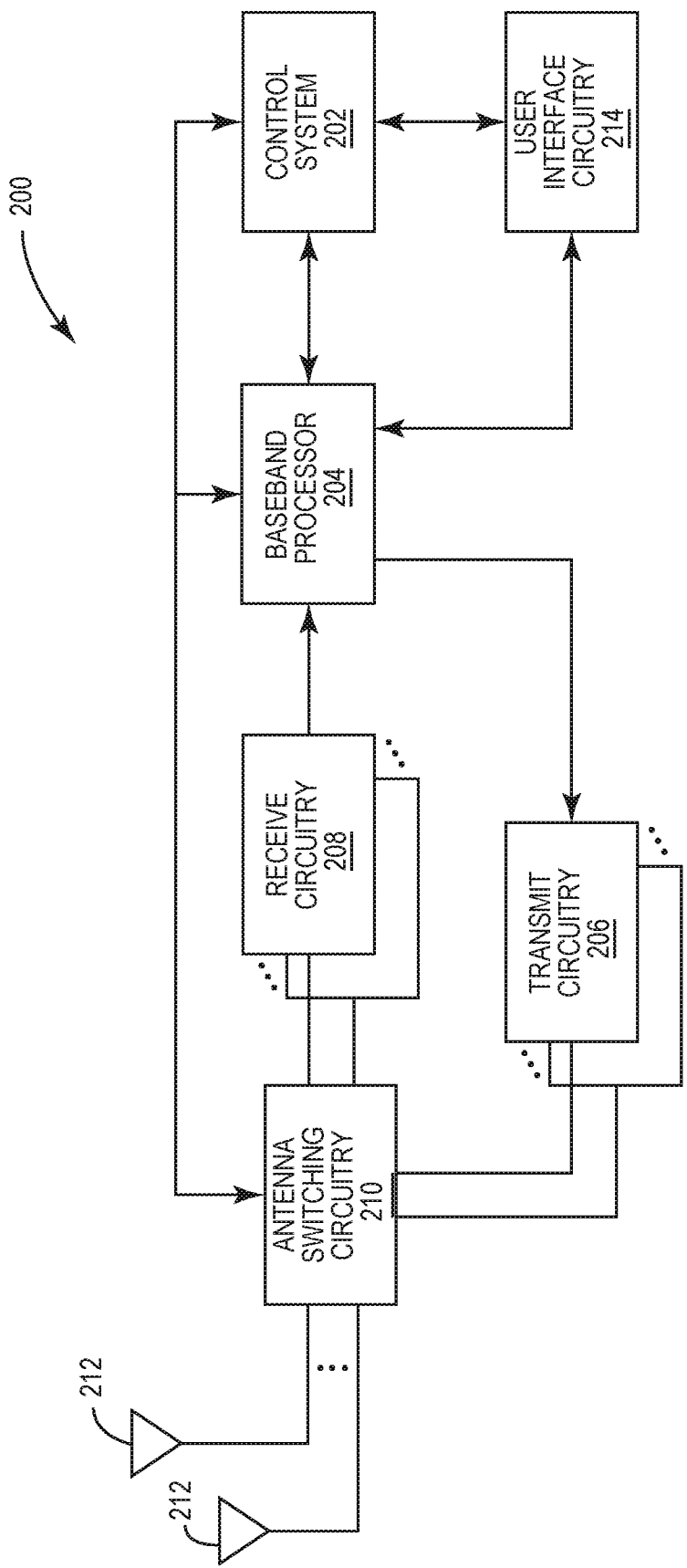
FIG. 6 illustrates a block diagram of an example communication device that includes at least one frequency synthesizer illustrated in FIGS. 2-5.

FIG. 6 illustrates a block diagram of example communication devices that include at least one frequency synthesizer 100, which is capable of generating different local oscillator frequencies for UWB applications by utilizing the single VCO 102. The concepts described above may be implemented in various types of communication devices 200, such as mobile terminals, smart watches, tablets, computers, navigation devices, access points, and like wireless communication devices that support wireless communications, such as cellular, wireless local area network (WLAN), BLUETOOTH, and near field communications. The communication devices 200 will generally include a control system 202, a baseband processor 204, transmit circuitry 206, receive circuitry 208, antenna switching circuitry 210, multiple antennas 212, and user interface circuitry 214. In a non-limiting example, the control system 202 can be a field-programmable gate array (FPGA) or an application-specific integrated circuit (ASIC), as an example. In this regard, the control system 202 can include at least a microprocessor(s), an embedded memory circuit(s), and a communication bus interface(s). The receive circuitry 208 receives radio frequency signals via the antennas 212 and through the antenna switching circuitry 210 from one or more base stations. A low noise amplifier and a filter of the receive circuitry 208 cooperate to amplify and remove broadband interference from the received signal for processing. Down conversion and digitization circuitry (not shown) will then down convert the filtered, received signal to an intermediate or baseband frequency signal, which is then digitized into one or more digital streams using analog-to-digital converter(s) (ADC).

The baseband processor 204 processes the digitized received signal to extract the information or data bits conveyed in the received signal. This processing typically comprises demodulation, decoding, and error correction operations, as will be discussed in greater detail below. The baseband processor 204 is generally implemented in one or more digital signal processors (DSPs) and ASICs.

For transmission, the baseband processor 204 receives digitized data, which may represent voice, data, or control information, from the control system 202, which it encodes for transmission. The encoded data is output to the transmit circuitry 206, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal to the antennas 212 through the antenna switching circuitry 210. The multiple antennas 212 and the replicated transmit and receive circuitries 206, 208 may provide spatial diversity. Modulation and processing details will be understood by those skilled in the art. Herein, at least one of the baseband processer 204, the transmit circuitry 206, and the receive circuitry includes one or more frequency synthesizers 100 as illustrated in FIGS. 2-5.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A frequency synthesizer, comprising:
   a phase-frequency detector (PFD);
   a charge pump (CP);
   a high-frequency voltage controlled oscillator (VCO);
   a feedback divider, wherein the PFD, the CP, the high-frequency VCO, and the feedback divider are coupled in series in a closed loop; and
   a divider bank following the high-frequency VCO and not included in the closed loop, wherein:
      the high-frequency VCO has a tuning range of less than 35%, and is the only VCO within the frequency synthesizer;
      the divider bank includes two or more divider branches parallel to each other, each of which is configured to provide a different division ratio; and
      an oscillating spectrum of the high-frequency VCO and division ratios of the two or more divider branches are selected such that the divider bank is capable of providing a continuous spectrum with at least a 64% frequency coverage.

2. The frequency synthesizer of claim 1 wherein the spectrum provided by the divider bank covers all ultra-wideband (UWB) channels in Group 2.

3. The frequency synthesizer of claim 1 wherein the divider bank further includes a multiplexer (MUX), which is configured to select one output from the two or more divider branches.

4. The frequency synthesizer of claim 3 further comprising a group divider, a first group switch, and a second group switch, wherein:
   the group divider and the first group switch are coupled in series between the MUX of the divider bank and an output terminal of the frequency synthesizer; and
   the second group switch is parallel to the first group switch and coupled between the MUX of the divider bank and the output terminal of the frequency synthesizer.

5. The frequency synthesizer of claim 4 wherein:
   when the first group switch is open and the second group switch is closed, the output terminal of the frequency synthesizer is eligible to provide a spectrum covering all UWB channels in Group 2; and
   when the first group switch is closed and the second group switch is open, the output terminal of the frequency synthesizer is eligible to provide a spectrum proportional to the Group 2 UWB channels.

6. The frequency synthesizer of claim 5 wherein:
   the group divider has a division ratio of 2; and
   the output terminal of the frequency synthesizer is eligible to provide a spectrum covering all UWB channels in Group 1, when the first group switch is closed, and the second group switch is open.

7. The frequency synthesizer of claim 4 further comprising a buffer before the output terminal of the frequency synthesizer, wherein the group divider and the first group switch are coupled in series between the MUX of the divider bank and the buffer, and the second group switch is parallel to the first group switch and coupled between the MUX of the divider bank and the buffer.

8. The frequency synthesizer of claim 1 wherein:
   the high-frequency VCO has an oscillating spectrum that is N times a range of 16372 MHz to 20468 MHz, wherein N is an integer; and
   the two or more divider branches include a first divider branch, a second divider branch, and a third divider branch with a division ratio of 2*N, a division ratio of 2.5*N, and a division ratio of 3*N, respectively.

9. The frequency synthesizer of claim 8 wherein:
   the high-frequency VCO is capable of providing in-phase/quadrature (I/Q) signals; and
   N is equal to 1.

10. The frequency synthesizer of claim 8 wherein N is equal to 2.

11. The frequency synthesizer of claim 10 wherein:
    the first divider branch is implemented by two divide-by-2 dividers coupled in series;
    the second divider branch is implemented by one divide-by-2 divider and one divide-by-2.5 divider coupled in series; and
    the third divider branch is implemented by one divide-by-2 divider and one divide-by-3 divider coupled in series.

12. The frequency synthesizer of claim 8 wherein the divider bank further includes a MUX, which is configured to select one output from the first divider branch, the second divider branch, and the third divider branch.

13. The frequency synthesizer of claim 12 further comprising a group divider, a first group switch, and a second group switch, wherein:
    the group divider and the first group switch are coupled in series between the MUX of the divider bank and the output terminal of the frequency synthesizer; and
    the second group switch is parallel to the first group switch and coupled between the MUX of the divider bank and the output terminal of the frequency synthesizer.

14. The frequency synthesizer of claim 13 wherein:
    when the first group switch is open and the second group switch is closed, the output terminal of the frequency synthesizer is eligible to provide a spectrum covering all UWB channels in Group 2; and when the first group switch is closed and the second group switch is open, the output terminal of the frequency synthesizer is eligible to provide a spectrum proportional to the Group 2 UWB channels.

15. The frequency synthesizer of claim 14 wherein:
the group divider has a division ratio of 2; and
the output terminal of the frequency synthesizer is eligible to provide a spectrum covering all UWB channels in Group 1, when the first group switch is closed, and the second group switch is open.

16. The frequency synthesizer of claim 13 further comprising a buffer before the output terminal of the frequency synthesizer, wherein the group divider and the first group switch are coupled in series between the MUX of the divider bank and the buffer, and the second group switch is parallel to the first group switch and coupled between the MUX of the divider bank and the buffer.

17. The frequency synthesizer of claim 1 wherein the tuning range of the high-frequency VCO is limited to 15%-25%.

18. The frequency synthesizer of claim 1 wherein the tuning range of the high-frequency VCO is less than 30%.

19. The frequency synthesizer of claim 1 wherein the two or more divider branches are implemented by current mirror logic (CML) type dividers or true single phase clocked (TSPC) type dividers.

20. The frequency synthesizer of claim 1 further comprising a buffer, which is coupled between the high-frequency VCO and the feedback divider, included in the closed loop, and coupled between the high-frequency VCO and the divider bank.

21. A communication device comprising:
a baseband processor;
receive circuitry; and
transmit circuitry, wherein:
at least one of the baseband processor, the transmit circuitry, and the receive circuitry includes a frequency synthesizer;
the frequency synthesizer includes a phase-frequency detector (PFD), a charge pump (CP), a high-frequency voltage controlled oscillator (VCO), a feedback divider, and a divider bank;
the PFD, the CP, the high-frequency VCO, and the feedback divider are coupled in series in a closed loop;
the high-frequency VCO has a tuning range of less than 35%, and is the only VCO within the frequency synthesizer;
the divider bank follows the high-frequency VCO and is not included in the closed loop;
the divider bank includes two or more divider branches parallel to each other, each of which is configured to provide a different division ratio; and
an oscillating spectrum of the high-frequency VCO and division ratios of the two or more divider branches are selected such that the divider bank is capable of providing a continuous spectrum with at least a 64% frequency coverage.

* * * * *